(12) United States Patent  (10) Patent No.: US 7,881,895 B2
Haartsen et al.  (45) Date of Patent: Feb. 1, 2011

(54) METHODS OF CALIBRATING A CLOCK USING MULTIPLE CLOCK PERIODS WITH A SINGLE COUNTER AND RELATED DEVICES AND METHODS

(75) Inventors: Jacobus Cornelis Haartsen, Hardenberg (NL); Aalbert Stek, Emmen (NL)

(73) Assignee: Sony Ericsson Mobile Communications AB, Lund (SE)

( * ) Notice: Subject to any disclaimer, the term of this patent is extended or adjusted under 35 U.S.C. 154(b) by 331 days.

(21) Appl. No.: 12/127,336

(22) Filed: May 27, 2008

(65) Prior Publication Data

US 2009/0296531 A1  Dec. 3, 2009

(51) Int. Cl.
*G01D 18/00* (2006.01)
(52) U.S. Cl. ....................................... 702/89
(58) Field of Classification Search ................. 702/89
See application file for complete search history.

(56) References Cited

U.S. PATENT DOCUMENTS

| 5,424,664 | A | 6/1995 | Philips |
| 5,488,645 | A | 1/1996 | Mori et al. |
| 5,663,970 | A | 9/1997 | Bae |
| 5,995,820 | A | 11/1999 | Young |
| 6,016,312 | A | 1/2000 | Storm et al. |

(Continued)

FOREIGN PATENT DOCUMENTS

| EP | 0 939 495 A1 | 9/1999 |
| EP | 1 503 506 A1 | 2/2005 |
| EP | 1 551 102 A1 | 8/2005 |
| EP | 1 585 223 A1 | 10/2005 |

(Continued)

OTHER PUBLICATIONS

Invitation to Pay Additional Fees and, Where Applicable, Protest Fee (7 pages) corresponding to International Application No. PCT/IB2008/055001; Mailing Date: Apr. 1, 2009.

(Continued)

*Primary Examiner*—Aditya Bhat
(74) *Attorney, Agent, or Firm*—Myers Bigel Sibley & Sajovec

(57) ABSTRACT

A method of calibrating a first clock signal using a second clock signal and a plurality of calibration periods may include generating incremented counter values at a counter responsive to edges of the second clock signal. For at least two of the plurality of calibration periods, an initial incremented counter value from the counter may be stored in memory at an initial edge of the first clock signal for the respective calibration period, a final incremented counter value may be stored in memory at a final edge of the clock signal for the respective calibration period, and the at least two of the plurality of calibration periods may be overlapping with different initial and final edges of the first clock signal. For each of the plurality of calibration periods, a number of edges of the second clock signal occurring during the respective calibration period may be determined using the initial and final incremented counter values stored in memory. A relationship between the first and second clock signals may be determined using a sum of a number of edges of the second clock signal occurring during each of the plurality of calibration periods and using a sum of a number of first clock signal cycles occurring during each of the plurality of calibration periods.

17 Claims, 8 Drawing Sheets

U.S. PATENT DOCUMENTS

| | | |
|---|---|---|
| 6,088,602 A | 7/2000 | Banister |
| 6,124,764 A | 9/2000 | Haartsen et al. |
| 6,304,517 B1 | 10/2001 | Ledfelt et al. |
| 6,889,055 B1 | 5/2005 | Neufeld |
| 7,068,557 B2 | 6/2006 | Norman |
| 7,079,977 B2 | 7/2006 | Osorio |
| 7,209,401 B2 | 4/2007 | Norman |
| 7,248,124 B2 | 7/2007 | McCorquodale |
| 7,250,825 B2 | 7/2007 | Wilson et al. |
| 7,272,078 B1 | 9/2007 | Haartsen |
| 7,321,837 B2 | 1/2008 | Osorio et al. |
| 2003/0095008 A1 | 5/2003 | Kranz |
| 2005/0221870 A1 | 10/2005 | Erdelyi |
| 2005/0241362 A1 | 11/2005 | Oberle et al. |
| 2006/0155491 A1 | 7/2006 | Bode |
| 2006/0155495 A1 | 7/2006 | Osorio |
| 2007/0222528 A1 | 9/2007 | Pernia |
| 2007/0222529 A1 | 9/2007 | Carichner |
| 2008/0001744 A1* | 1/2008 | Batra et al. ............... 340/572.1 |

FOREIGN PATENT DOCUMENTS

| | | |
|---|---|---|
| GB | 2 397 465 A | 7/2004 |
| JP | 05-067967 | 3/1993 |
| WO | WO 2006/040699 A1 | 4/2006 |

OTHER PUBLICATIONS

International Search Report and Written Opinion (23 pages) corresponding to International Application No. PCT/IB2008/055001; Mailing Date: Jan. 12, 2009.

Bode et al. "Improved Method for Measuring Frequency Ratios in GSM Mobile Phones" *IEEE Custom Integrated Circuits Conference*, pp. 621-624, 2004.

* cited by examiner $$IP(j) = \sum_{i=0}^{j} P(i)$$

$$IP(N) = \sum_{i=0}^{N} P(i)$$

$$IIP(N) = \sum_{j=1}^{N} IP(j-1) = \sum_{j=0}^{N} \sum_{i=0}^{j-1} P(i) = \sum_{i=0}^{N-1} (N-i) \cdot P(i) = \sum_{i=0}^{N} (N-i) \cdot P(i)$$

$$IIP(N) = N \cdot \sum_{i=0}^{N} P(i) - \sum_{i=0}^{N} i \cdot P(i)$$

$$f_{CSLP}(estimate) = \frac{N \cdot (N+1) \cdot (N+2)}{6 \cdot N \cdot IP(N) - 12 \cdot IIP(N)} \cdot f_{CSR}$$

| T[ms] | i | P(I) | IP(I) | IIP(I) |
|---|---|---|---|---|
| 0.000 | 0 | 0 | 0 | 0 |
| 0.031 | 1 | 812 | 812 | 0 |
| 0.063 | 2 | 1625 | 2437 | 812 |
| 0.094 | 3 | 2437 | 4874 | 3249 |
| 0.125 | 4 | 3250 | 8124 | 8123 |
| 0.156 | 5 | 4062 | 12186 | 16247 |
| 0.188 | 6 | 4875 | 17061 | 28433 |
| 0.219 | 7 | 5687 | 22748 | 45494 |
| 0.250 | 8 | 6500 | 29248 | 68242 |
| 0.281 | 9 | 7312 | 36560 | 97490 |
| 0.313 | 10 | 8125 | 44685 | 134050 |
| 0.344 | 11 | 8937 | 53622 | 178735 |
| 0.375 | 12 | 9750 | 63372 | 232357 |
| 0.406 | 13 | 10562 | 73934 | 295729 |
| 0.438 | 14 | 11375 | 85309 | 369663 |
| 0.469 | 15 | 12187 | 97496 | 454972 |
| 0.500 | 16 | 13000 | 110496 | 552468 |
| 0.531 | 17 | 13812 | 124308 | 662964 |
| 0.563 | 18 | 14625 | 138933 | 787272 |
| 0.594 | 19 | 15437 | 154370 | 926205 |
| 0.625 | 20 | 16250 | 170620 | 1080575 |
| 0.656 | 21 | 17062 | 187682 | 1251195 |
| 0.688 | 22 | 17875 | 205557 | 1438877 |
| 0.719 | 23 | 18687 | 224244 | 1644434 |
| 0.750 | 24 | 19500 | 243744 | 1868678 |
| 0.781 | 25 | 20312 | 264056 | 2112422 |
| 0.813 | 26 | 21125 | 285181 | 2376478 |
| 0.844 | 27 | 21937 | 307118 | 2661659 |
| 0.875 | 28 | 22750 | 329867 | 2968777 |
| 0.906 | 29 | 23562 | 353430 | 3298645 |
| 0.938 | 30 | 24375 | 377805 | 3652075 |
| 0.969 | 31 | 25187 | 402992 | 4029880 |
| 1.000 | 32 | 26000 | 428992 | 4432872 |

Figure 13

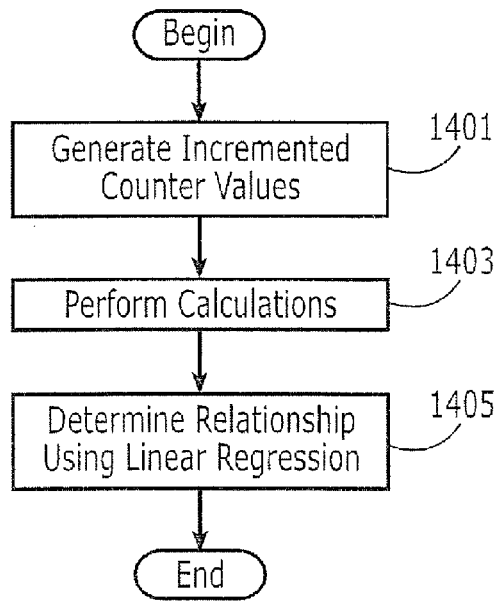
Figure 14
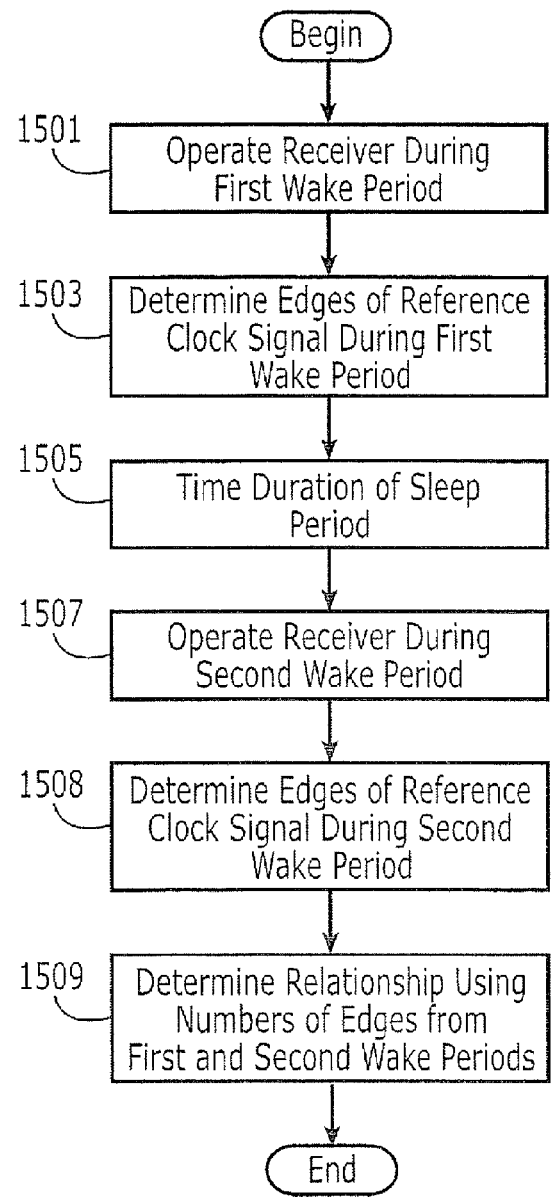
Figure 15
$$f_{CSLP}(estimate) = \frac{f_{CSR}}{R} = \frac{N \cdot (N+1) \cdot (N+2)}{12 \cdot \sum_{i=0}^{N} i \cdot P(i) - 6 \cdot N \cdot \sum_{i=0}^{N} P(i)} \cdot f_{CSR}$$
Figure 16

METHODS OF CALIBRATING A CLOCK USING MULTIPLE CLOCK PERIODS WITH A SINGLE COUNTER AND RELATED DEVICES AND METHODS

FIELD OF THE INVENTION

The present invention relates generally to the field of electronics, and more particularly, to methods of calibrating electronic clocks and related devices.

BACKGROUND

There is a wide variety of digital communication systems, some presently in existence, and some still under development. Digital communication systems include time-division multiple access (TDMA) systems, such as cellular radio telephone systems that comply with the Global System for Mobile communications (GSM) telecommunication standard and its enhancements like GSM/EDGE, and Code-Division Multiple Access (CDMA) systems, such as cellular radio telephone systems that comply with the IS-95, cdma2000, and Wideband CDMA (WCDMA) telecommunication standards. Digital communication systems also include "blended" TDMA and CDMA systems, such as cellular radio telephone systems that comply with the Universal Mobile Telecommunications System (UMTS) standard, which specifies a third generation (3G) mobile system being developed by the European Telecommunications Standards Institute (ETSI) within the International Telecommunication Union's (ITU's) IMT-2000 framework. The Third Generation Partnership Project (3GPP) promulgates the UMTS standard. High Speed Downlink Packet-data Access (HSDPA) is an evolution of WCDMA specified in the Release 5 version of the 3GPP WCDMA specification. The 3GPP has begun considering the next major step or evolution of the 3G standard (sometimes called Super 3G—"S3G") to ensure the long-term competitiveness of 3G.

Other types of digital communication systems allow equipment to collaborate with one another by means of wireless networks. Examples include Wireless Local Area Network (WLAN) and Bluetooth equipment.

One thing that these different systems have in common is the need to maintain accurate timing. In modern radio transceivers (e.g., WCDMA, GSM and S3G phones and WLAN and Bluetooth equipment), two different clocks are used: a system clock (SC) and a real-time clock (RTC). The SC is usually a high frequency clock, running at several MHz, and generated by a highly stable oscillator, often applying a temperature-controlled crystal. The SC acts as the reference and is the frequency source for all radio related operations, such as radio frequency (RF) carrier synthesis. The crystals used for the SC have an accuracy on the order of 20 parts per million (ppm). However, for cellular terminals, this accuracy is improved by locking the SC to the downlink signals transmitted by the mobile network base stations. The SC is tuned to the downlink signals and therefore inherits the better stability of the clock reference used in the base station, which is about 0.5 ppm.

The SC's stability is obtained at the expense of electrical current consumption. To run the SC, several of milliAmperes (mA) are required. In particular, the SC requires too much current when the transceiver is in idle mode or in a low-power mode in which it sleeps most of the time. Therefore, the SC is turned off during the sleep states. In order to preserve timing during such sleep states, each modern transceiver also includes a non-reference clock, such as a low-power oscillator (LPO) or real-time clock (RTC) which runs at a much lower level of current consumption (several tens to hundreds of micro Amperes). The RTC usually runs at a much lower frequency than the SC, typically several kHz.

The RTC is used for several timing operations in the cellular terminal. It controls the sleep periods, and determines such things as when the terminal has to wake up to monitor the paging control channel or scan other broadcast control channels. The RTC also determines for how long uplink synchronization with the network can be maintained. Uplink synchronization is critical in time slotted systems, (i.e., systems that have a TDMA component, such as GSM and the newly developed Long Term Evolution (LTE) for 3G systems (S3G)). Due to the unknown round-trip propagation delay between the terminal and the base station, timing advance (TA) control messages need to be sent to the terminal in order to align the receive timing of its uplink transmissions with the timing of other uplink transmissions. Clock drift is a general cause for uplink timing mismatch, and requires the terminal to send uplink bursts frequently so that the base station can measure the timing misalignment and suitably command the terminal to adjust its timing by way of the TA message.

The inherent stability of the RTC is very poor, typically from 50 to 100 ppm. However, its stability is improved by repeated calibrations. The SC is used as a stable reference during the calibration. Once the RTC is calibrated, it has a level of stability close to the stability of the SC. In between calibration events, the stability remains within a few ppm.

U.S. Pat. No. 6,124,764 describes a calibration method that exploits the periodic paging wake-up times. In particular, the LPO output signal is monitored during a number of monitoring windows M. These windows preferably correspond to the wake-up periods in the standby mode of the host system that the LPO is part of. During wake-up periods, other activities such as page scanning, for example, may take place. The results of the monitoring process are accumulated. Based on the accumulated result derived from M monitoring windows, a decision for the correction scheme is determined for the next period encompassing another M monitoring windows.

Conventional calibration techniques have a problem in that they require quite a long calibration time. During the calibration, the SC has to run and this causes a high level of current consumption to be experienced. In order to limit the power consumption, the calibration duty cycle is kept low. However, this means that there is quite a long time between consecutive calibration updates. During this time, the RTC may drift too far away. Since the RTC controls the uplink timing, this drift will require uplink bursts to be sent to the base station frequently to support the TA procedure. The terminal expends power when it sends an uplink burst, and this reduces the terminal standby time. Furthermore, all of these uplink bursts increase overhead in the network.

SUMMARY

According to some embodiments of the present invention, a method of calibrating a first clock signal using a second clock signal and a plurality of calibration periods may include generating incremented counter values at a counter responsive to edges of the second clock signal. For at least two of the plurality of calibration periods, an initial incremented counter value from the counter at an initial edge of the first clock signal may be stored in memory for the respective calibration period, and a final incremented counter value at a final edge of the first clock signal may be stored in memory for the respective calibration period. Moreover, the at least two of the plurality of calibration periods may be overlapping with different initial and final edges of the first clock signal. For each of the plurality of calibration periods, a number of edges of the second clock signal occurring during the respective calibration period may be determined using the initial and final incremented counter values stored in memory. A relationship between the first and second clock signals may be determined using a sum of a number of edges of the second clock signal occurring during each of the plurality of calibration periods and using a sum of a number of first clock signal cycles occurring during each of the plurality of calibration periods.

Determining the relationship may include determining a ratio using the sum of the number of edges of the second clock signal occurring during each of the plurality of calibration periods and using the sum of the number of first clock signal cycles occurring during each of the plurality of calibration periods. An initial edge of the first clock signal for a first of the plurality of the calibration periods may precede an initial edge of the first clock signal for a second of the plurality of the calibration periods, the initial edge of the first clock signal for the second of the plurality of the calibration periods may precede a final edge of the first clock signal for the first of the plurality of the calibration periods, and the final edge of the first clock signal for the first of the plurality of the calibration periods may precede a final edge of the first clock signal for the second of the plurality of the calibration periods.

A same number of first clock cycles may occur during each of the plurality of calibration periods, and/or the plurality of calibration periods may include k calibration periods beginning at k consecutive edges of the same transition type of the first clock (wherein k is a positive whole number). Generating incremented counter values may include generating incremented counter values at the counter responsive to edges of a same transition type of the second clock signal (with a transition type being either a rising or falling edge). More particularly, the initial and final edges of the first clock signal may be edges of a same transition type.

The second clock may be coupled to a receiver, and during first and second waking periods, the receiver may be operated using the second clock. During a sleep period between the first and second waking periods, a duration of the sleep period may be timed using the first clock with the second clock turned off.

According to other embodiments of the present invention, a method of calibrating a first clock signal using a second clock signal may include generating incremented counter values at a counter responsive to edges of the second clock signal. For at least two different edges of the first clock signal, calculations may be performed based on respective incremented counter values. A relationship between the first and second clock signals may be determined using linear regression using the calculations based on the respective incremented counter values for the at least two different edges of the first clock signal.

Performing calculations based on the respective incremented counter values may include performing the calculations based on the respective incremented counter values taken at edges of the same transition type of respective cycles of the first clock signal. Determining the relationship between the first and second clock signals using linear regression may include calculating a regression coefficient using the incremented counter values from the at least two different edges of the first clock signal. Performing calculations based on the respective incremented counter values may include integrating incremented counter values taken at edges of the same transition type of different cycles of the first clock signal. The at least two different edges of the first clock signal may include at least two consecutive edges of the first clock signal of the same transition type.

At a first edge of the first clock signal, the counter and first and second adders may be set to initial values. At a second edge of the first clock signal after the first edge, an incremented counter value generated by the counter may be added to the initial value of the first adder to generate a second value of the first adder, and the initial value of the first adder may be added to the initial value of the second adder to generate a second value of the second adder. At a third edge of the first clock signal after the second edge, an incremented counter value generated by the counter may be added to the second value of the first adder to generate a third value of the first adder, and the second value of the first adder may be added to the first value of the second adder to generate a third value of the second adder.

The second clock may be coupled to a receiver, and during a first waking period, the receiver may be operated using the second clock. During a sleep period after the first waking period, a duration of the sleep period may be time using the first clock with the second clock turned off. During a second waking period after the sleep period, the receiver may be operated using the second clock.

According to still other embodiments of the present invention, a method of calibrating a first clock signal using a second clock signal coupled to a receiver may include operating the receiver using the second clock signal during a first waking period. For a first calibration period during the first waking period, a number of edges of the second clock signal occurring during the first calibration period may be determined, and during a sleep period after the first waking period, a duration of the sleep period may be timed using the first clock signal with the second clock signal turned off. During a second waking period after the sleep period, the receiver may be operated using the second clock signal, and for a second calibration period during the second waking period, a number of edges of the second clock signal occurring during the second calibration period may be determined. A relationship between the first and second clock signals may be determined using the number of edges of the second clock signal occurring during the first interval and the number of edges of the second clock signal occurring during the second interval.

Determining the relationship between the first and second clock signals may include calculating an average based on the number of edges of the second clock signal occurring during the first calibration period and the number of edges of the second clock signal occurring during the second calibration period.

For a third calibration period during the first waking period, a number of edges of the second clock signal occurring during the third calibration period may be determined, and for a fourth calibration period during the second waking period, a number of edges of the second clock signal occurring during the fourth calibration period may be determined. Determining the relationship between the first and second clock signals may include determining a first representation of the relationship between the first and second clock signals for the first waking period using the number of edges of the second clock signal occurring during the first calibration period and the number of edges of the second clock signal occurring during the third calibration period. A second representation of the relationship between the first and second clock signals for the second waking period may be determined using the number of edges of the second clock signal occurring during the second calibration period and the number of edges of the second clock signal occurring during the fourth calibration period. After determining the first and second representations of the relationship between the first and second clock signals, an aggregate representation of the relationship between the first and second clock signals may be determined using the first and second representations.

According to other embodiments of the present invention, determining the relationship between the first and second clock signals may include determining a first representation of the relationship between the first and second clock signals using the number of edges of the second clock signal occurring during the first calibration period and the number of edges of the second clock signal occurring during the second calibration period. A second representation of the relationship between the first and second clock signals may be determined using the number of edges of the second clock signal occurring during the third calibration period and the number of edges of the second clock signal occurring during the fourth calibration period. After determining the first and second representations of the relationship between the first and second clock signals, an aggregate representation of the relationship between the first and second clock signals may be determined using the first and second representations. According to other embodiments of the present invention, determining the relationship between the first and second clock signals may include performing linear regression using the number of edges of the second clock signal occurring during the first calibration period, the number of edges of the second clock signal occurring during the second calibration period, the number of edges of the second clock signal occurring during the third calibration period, and the number of edges of the second clock signal occurring during the fourth calibration period.

BRIEF DESCRIPTION OF THE DRAWINGS

FIG. 13 is a table illustrating outputs of adding circuits of FIG. 8 according to some embodiments of the present invention.

FIGS. 14 and 15 are flow charts illustrating operations of calibrating low power clock signal CSLP using reference clock signal CSR according to some embodiments of the present invention.

FIG. 16 illustrates an equation used to estimate frequencies with linear regression according to some embodiments of the present invention.

DETAILED DESCRIPTION

Figure 1:
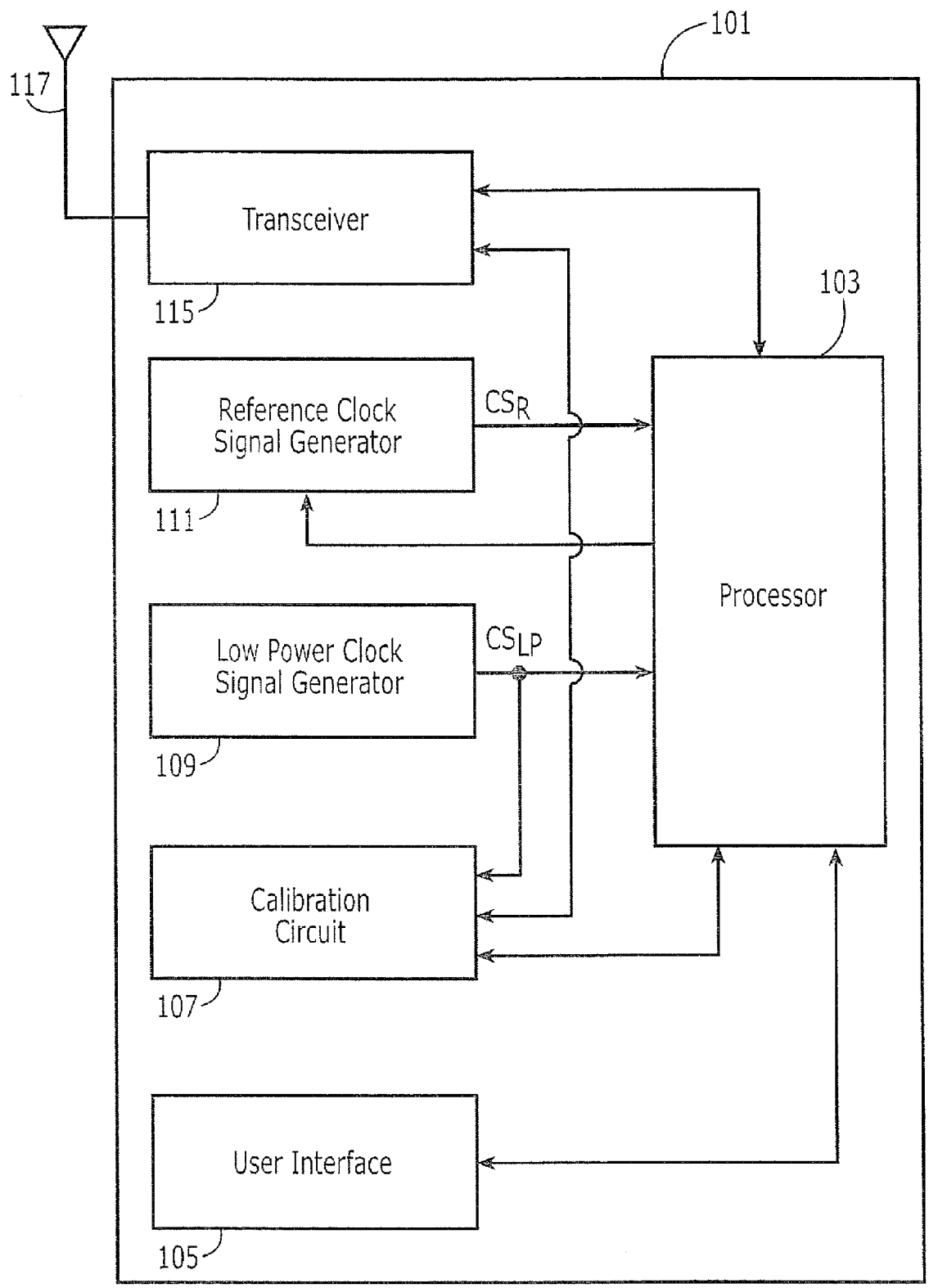
FIG. 1 is a block diagram illustrating a mobile communications device according to some embodiments of the present invention.

Specific exemplary embodiments of the invention now will be described with reference to the accompanying drawings. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawing, like numbers refer to like elements. It will be understood that when an element is referred to as being "connected" or "coupled" to another element, it can be directly connected or coupled to the other element or intervening elements may be present. Furthermore, "connected" or "coupled" as used herein may include wirelessly connected or coupled.

The terminology used herein is for the purpose of describing particular embodiments only and is not intended to be limiting of the invention. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be understood that although the terms first and second are used herein to describe various elements, these elements should not be limited by these terms. These terms are only used to distinguish one element from another element. As used herein, the term "and/or" includes any and all combinations of one or more of the associated listed items. The symbol "/" is also used as a shorthand notation for "and/or".

Various embodiments of the present invention are described below with reference to block diagrams illustrating methods, apparatus and computer program products according to various embodiments of the invention. It will be understood that each block of the block diagrams and/or operational illustrations, and combinations of blocks in the block diagrams and/or operational illustrations, can be implemented by analog and/or digital hardware, and/or computer program instructions. These computer program instructions may be provided to a processor of a general purpose computer, special purpose computer, ASIC, and/or other programmable data processing apparatus, such that the instructions, which execute via the processor of the computer and/or other programmable data processing apparatus, create means for implementing the functions/acts specified in the block diagrams and/or operational illustrations. Accordingly, it will be appreciated that the block diagrams and operational illustrations support apparatus, methods and computer program products.

FIG. 1 is a block diagram illustrating a mobile communications device 101 (e.g., a mobile radiotelephone, a personal digital assistant or PDA, a handheld computer, a laptop computer, a notebook computer, etc.) according to some embodiments of the present invention. The mobile communications device 101 (also referred to as a mobile device) may include a processor 103, a user interface 105, a calibration circuit 107, a low power clock signal generator 109, a reference clock signal generator 111, a transceiver 115, and an antenna 117. The transceiver 115 may include both a transmitter and a receiver to provide both transmission and reception of radio communications, the transceiver 115 may include only a transmitter to provide only transmission of radio communications, or the transceiver 115 may include only a receiver to provide only reception of radio communications. The user interface 105 may include an image display (such as an LCD screen), a keypad, a joystick, a dial, directional buttons, a touch sensitive image display, a speaker, a microphone, etc.

The reference clock signal generator 111 (also referred to as a system clock) may include a highly stable oscillator configured to generate a relatively high frequency reference clock signal CSR used as a frequency source for all radio related operations (such as radio frequency carrier synthesis) performed by the transceiver 115 during transmission and/or reception of radio signals. The reference clock signal CSR may have a frequency on the order of MHz (e.g., 26 MHz). Moreover, the reference clock signal CSR may provide relatively high accuracy, for example, on the order of 20 ppm (parts per million) or even 0.5 ppm.

The low power clock signal generator 109 (also referred to as a low-power oscillator or real-time clock) may be configured to generate a relatively low frequency low power clock signal CSLP used preserve timing during sleep mode operations of the mobile device 101. The low power clock signal CSLP may have a frequency on the order of kHz (e.g., 32 kHz). Moreover, the low power clock signal CSLP may provide relatively low accuracy. According to embodiments of the present invention, reference clock signal CSR may have a frequency that is significantly greater than a frequency of low power clock signal CSLP. For example, a frequency of reference clock signal CSR may be at least 100 times greater than a frequency of low power clock signal.

The processor 103 may process communications received from and/or communications to be transmitted through transceiver 115 responsive to user input received through user interface 105. The processor 103, for example, may process voice communications, network communications (such as Internet communications), text communications, data communications, etc. During periods of active communications (e.g., when radio communications are being transmitted/received through transceiver 115), the reference clock signal generator 111 may generate the relatively high frequency reference clock signal CSR that is used by the transceiver 115.

When the mobile device is not actively communicating using transceiver 115, the mobile device 101 may operate in a low power sleep state with the reference clock signal generator 111 turned off to conserve battery power. During the sleep state, low power clock signal CSLP (generated by low power clock signal generator 109) is used to preserve timing of processor 103. During a low power sleep state, low power clock signal CSLP may be used to determine when processor 103, transceiver 115, and reference clock signal generator 111 should wake to monitor a paging control signal and/or to scan broadcast control channels.

Because an accuracy of low power clock signal CSLP may be relatively low, calibration circuit 107 may be used to more accurately determine a period and/or frequency of low power clock signal CSLP using reference clock signal CSR. By providing processor 103 with a more accurate determination of a period and/or frequency of low power clock signal CSLP, intervals between wake periods may be more accurately determined to further conserve battery power. Methods used by calibration circuits to determine a period and/or frequency of a low power clock signal CSLP are discussed in U.S. Pat. No. 7,272,078 to J. Haartsen entitled "Efficient Clock Calibration In Electronic Equipment," the disclosure of which is hereby incorporated herein in its entirety by reference. While the calibration circuit 107 and processor 103 are illustrated as separate blocks for the sake of clarity, it will be understood that some or all functions/elements of calibration circuit 107 may be included in processor 103 and/or other blocks of FIG. 1.

Figure 2:
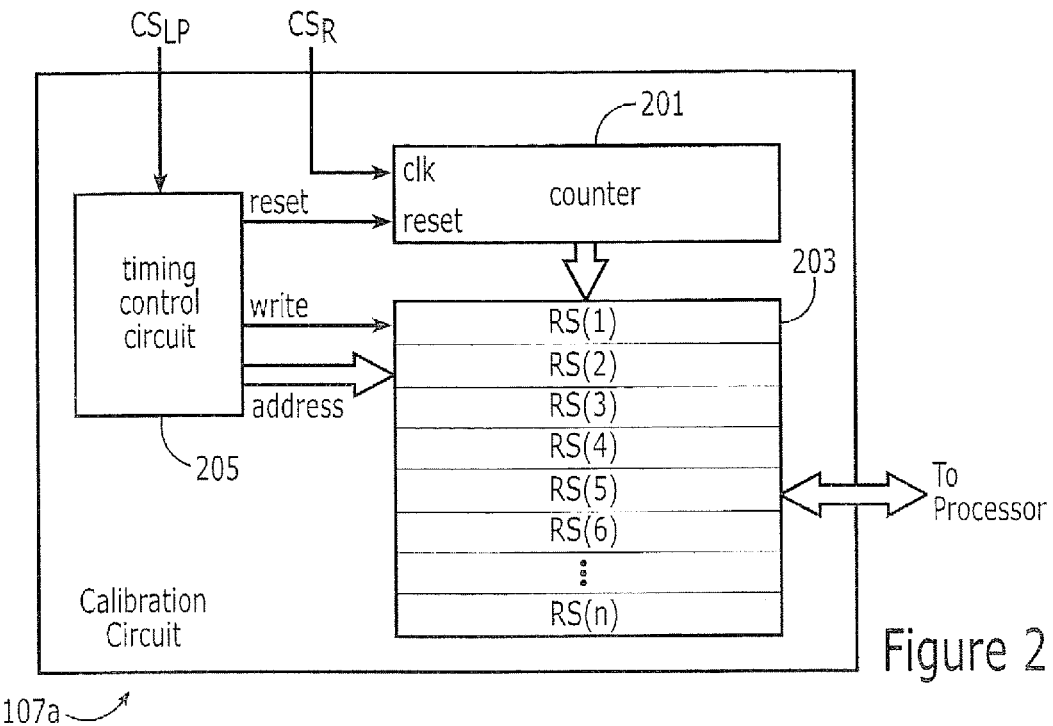
FIG. 2 is a block diagram of a calibration circuit that may be used to count reference clock signal cycles for overlapping calibration periods according to some embodiments of the present invention.

FIG. 2 is a block diagram of a calibration circuit 107A that may be used to count reference clock signal CSR cycles (e.g., counting rising edges or counting falling edges of the reference clock signal CSR) for overlapping calibration periods using a single counter according to some embodiments of the present invention. As shown in FIG. 2, the calibration circuit 107A may include a counter 201, memory 203 (including a plurality of memory registers RS(1) to RS(n)), and a timing control circuit 205.

Figure 3:
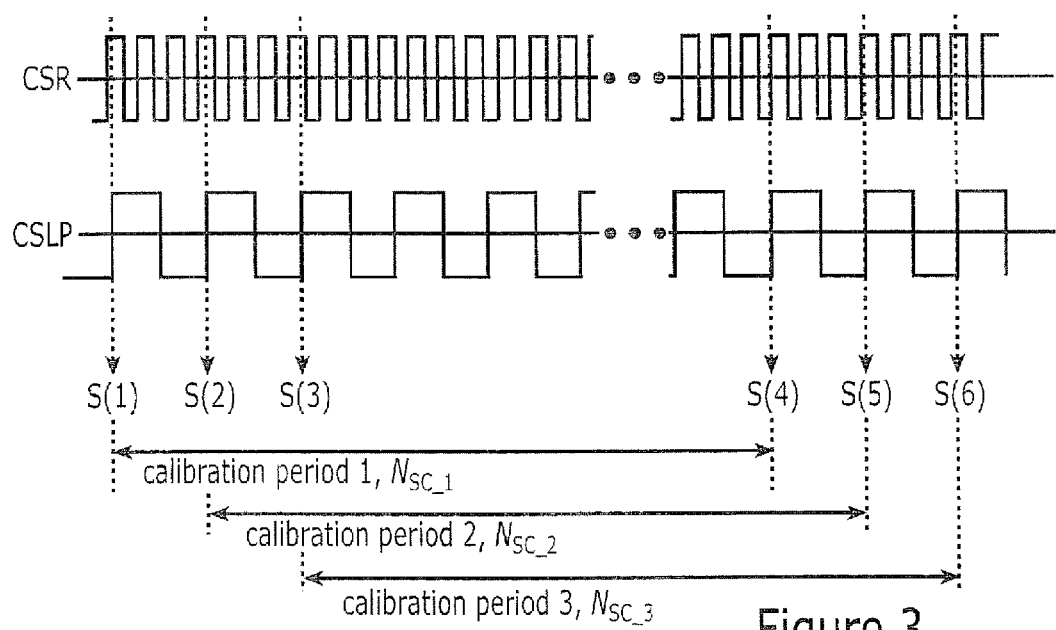
FIG. 3 is a timing diagram illustrating a reference clock signal and a low power clock signal as used to calibrate the low power clock signal according to some embodiments of the present invention.

Operations of the calibration circuit will be discussed in greater detail with reference to the timing diagram of FIG. 3. In particular, FIG. 3 is a timing diagram illustrating reference clock signal CSR and low power clock signal CSLP as used to calibrate low power clock signal CSLP according to some embodiments of the present invention. During a waking period of communications device 101 including calibration circuit 107A, transceiver 115 may be used to monitor a paging control signal and/or to scan broadcast control channels. Accordingly, reference clock signal generator 111 may be turned on to generate reference clock signal CSR that is used by transceiver 115 (e.g., for radio frequency carrier synthesis). At the same time (during the waking period), the reference clock signal CSR may also be used to calibrate the low power clock signal CSLP.

As shown in FIG. 2, counter 201 may generate incremented counter values responsive to rising edges of reference clock signal CSR. While counter values are discussed by way of example as being incremented responsive to rising edges of reference clock signal CSR, counter values could be incremented responsive to falling edges of reference clock signal CSR according to other embodiments of the present invention. As noted above, a frequency of clock signal CSR is significantly higher than a frequency of low power clock signal CSLP. As discussed herein, an incremented counter value may incrementally increase responsive to each rising edge of reference clock signal CSR. It will be understood, however, that an incremented counter value may incrementally decrease responsive to each rising edge of reference clock signal CSR. Either way, a difference in incremented counter values at the beginning and end of a calibration period may be used to determine a number of edges of a same transition type (e.g., either rising or falling) of reference clock signal CSR that occur during a calibration period (over a known number of cycles of low power clock signal CSLP). According to other embodiments of the present invention, counter values may be incremented responsive to rising and falling edges of the reference clock signal CSR, for example, if the reference clock signal CSR has a 50% duty cycle. According to other embodiments of the present invention, counter values may be incremented responsive to rising edges during some calibration windows (or waking periods), and counter values may be incremented responsive to falling edges during other calibration windows (or waking periods).

Timing control circuit 205 may generate a reset signal for counter 201 and write command and address information for memory 203 responsive to low power clock signal CSLP. Before beginning calibration operations during a waking period, an output of counter 201 may be reset (e.g., to zero) responsive to a reset signal generated by timing control circuit 205, and an output of counter 201 may be incremented responsive to subsequent rising edges of reference clock signal CSR.

At different rising edges of the low power clock signal CSLP, respective incremented counter values P(1) to P(6) may be stored in respective memory registers RS(1) to RS(6) of memory 203 responsive to write command and address information generated by timing control circuit 205. Pairs of incremented counter values (e.g., P(1) and P(4), P(2) and P(5), and P(3) and P(6)) for respective calibration periods (e.g., NSC_1, NSC_2, and NSC_3) may be stored in memory 203, and a difference between initial and final values of a pair may define a number of rising edges (or a number of falling edges) of the reference clock signal during the respective calibration period.

By way of example, incremented counter values P(1), P(2), and P(3) may be initial incremented counter values for first, second, and third calibration periods NSC_1, NSC_2, and NSC_3, respectively, and incremented counter values P(4), P(5), and P(6) may be final incremented counter values for first, second, and third calibration periods NSC_1, NSC_2, and NSC_3, respectively. As shown in FIG. 3, initial incremented counter values P(1), P(2), and P(3) may be taken as outputs of counter 201 at consecutive rising edges of low power clock signal CSLP; final incremented counter values P(4), P(5), and P(6) may be taken as outputs of counter 201 at consecutive rising edges of low power clock signal CSLP; and a duration of each of calibration period NSC_1, NSC_2, and NSC_3 may be defined by a same number of cycles of low power clock signal CSLP. According to other embodiments of the present invention, however, calibration periods may have different durations (e.g., different numbers of cycles of low power clock signal CSLP), initial incremented counter values may be taken at non-consecutive rising edges of the low power clock signal CSLP, and/or final incremented counter values may be taken at non-consecutive rising edges of the low power clock signal CSLP.

By providing that each of calibration periods NSC_1, NSC_2, and NSC_3 has a same duration (measured as cycles of low power clock signal CSLP) known to processor 103, processor 103 can determine a frequency relationship between reference clock signal CSR and low power clock signal CSLP using only incremented counter values P(1) to P(6) saved in respective memory registers RS(1) to RS(6). While three calibration periods are discussed by way of example, any number of calibration periods may be used. If counter 201 is reset to 0 at the beginning of calibration period NSC_1, it may be unnecessary to save initial counter value P(1) in memory 203 because a number of edges of reference clock signal CSR occurring during calibration period NSC_1 will be equal to final counter value P(4).

Over a waking period, a number of edges (of a same transition type) of reference clock signal CSR may be determined by processor 103 for each of a plurality of overlapping calibration periods using initial and final incremented counter values P(1) to P(6) saved in memory registers RS(1) to RS(6). Accordingly, processor 103 can determine a relationship α between a frequency FCSR of reference clock signal and a frequency FCSLP such that:

FCSLP=αFCSR.

If NCSLP_i is the number of cycles of low power clock in a calibration period i, NCSR_i is the number of edges of reference clock signal CSR in a calibration period i, and k is the number of calibration periods, the relationship α may be calculated as:

$$\alpha = \frac{\sum_{i=1 \text{ to } k} N_{\text{CSLP}\_i}}{\sum_{i=1 \text{ to } k} N_{\text{CSR}\_i}}.$$

If each calibration period has a same number NCSLP of cycles of low power clock signal CSLP, the summation from i=1 to K of NCSLP_i may be calculated as K*NCSLP. In the example of FIG. 3, k=3. Moreover, the summation from i=1 to k of NCSR_i may be calculated as the summation of differences between final and initial incremented counter values for each calibration period. In the example of FIG. 3 the summation of NCSR_i may be calculated as [P(4)−P(1)]+[P(5)−P(2)]+[P(6)−P(3)].

Figure 4:
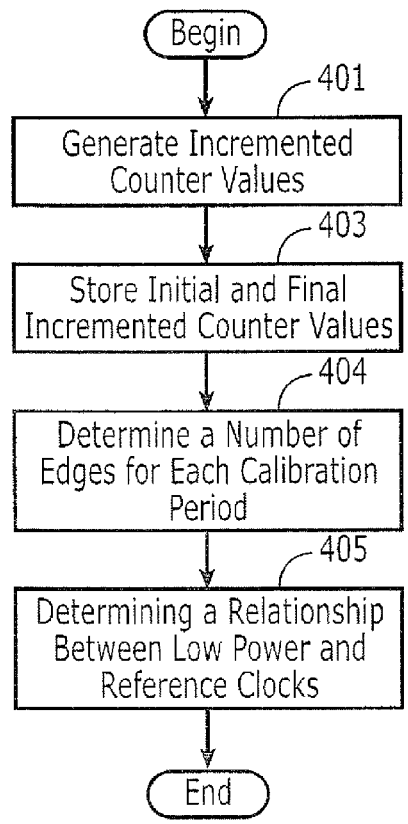
FIG. 4 is a flow diagram illustrating operations of calibrating low power clock signal CSLP using reference clock signal CSR according to some embodiments of the present invention.

FIG. 4 is a flow diagram illustrating operations of calibrating low power clock signal CSLP using reference clock signal CSR according to some embodiments of the present invention. Low power clock signal CSLP may be considered a low speed clock and reference clock signal CSR may be considered a high speed clock signal because a frequency of reference clock signal CSR is significantly greater than a frequency of low power clock CSLP. At block 401, incremented counter values may be generated at counter 201 responsive to edges of reference clock signal CSR.

Over a waking period with both of low power clock signal CSLP and reference clock signal CSR on, initial and final incremented counter values from counter 201 for a plurality of overlapping calibration periods NSC may be stored in respective memory registers RS of memory 203 at block 403. For each of the plurality of calibration periods NSC, a number of edges of reference clock signal CSR occurring during the respective calibration period may be determined using the initial and final incremented counter values stored in memory 203 at block 404. For example, differences between initial and final counter values for each of the calibration periods NSC may be used to determine a number of edges of a same transition type of reference clock signal CSR occurring during respective calibration periods NSC.

At block 405, processor 103 may determine a relationship between reference and low power clock signals CSR and CSLP using a sum of a number of edges of reference clock signal CSR occurring during each of the plurality of calibration periods NSC and using a sum of a number of low power clock signal CSLP cycles occurring during each of the plurality of calibration periods NSC. Determining the relationship, for example, may include determining a ratio using the sum of the number of edges of the reference clock signal CSR occurring during each of the plurality of calibration periods NSC and using the sum of the number of low power clock signal CSLP cycles occurring during each of the plurality of calibration periods NSC. A same number of low power clock cycles may occur during each of the plurality of calibration periods NSC, and the plurality of calibration periods may include k calibration periods beginning at k consecutive edges of the same transition type of the low power clock signal CSLP (where k is a positive whole number).

Figure 5:
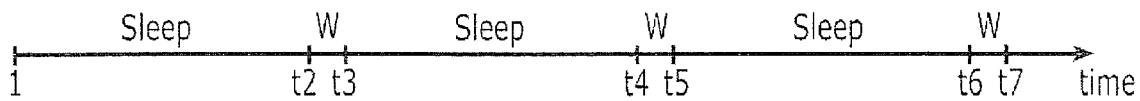
FIG. 5 is a time line illustrating sleep periods (Sleep) and wake periods (W) for a mobile device according to some embodiments of the present invention.

FIG. 5 is a time line illustrating sleep periods (Sleep) and wake periods (W) for mobile device 101 according to some embodiments of the present invention. More particularly, sleep periods between times t1 and t2, between times t3 and t4, and between times t5 and t6 (with reference clock signal CSR off) may be relatively long compared to wake periods between times t2 and t3, between times t4 and t5, and between times t6 and t7 (with reference clock signal CSR on).

Operations discussed above with respect to FIGS. 2-4 may be performed during each wake period when reference clock signal CSR is on so that processor 103 may more accurately time sleep periods using low power clock signal CSLP when reference clock signal CSR is off. By way of example, processor 103 can use the relationship α to more accurately determine a frequency and/or period of low power clock signal CSLP, and a new relationship α may be determined at each wake period for use during the subsequent sleep period without considering prior values of α. According to other embodiments of the present invention, values of α1, α2, α3, etc. from multiple wake periods may be combined to provide an average α that is used to time sleep periods. For example, a moving average of individual values of α1, α2, α3, etc. may be used to provide an average α, and/or a weighted average may be provided so that values of α for more recent wake periods are weighted more heavily in the calculation of the average α. According to still other embodiments of the present invention, individual values of α1, α2, α3, etc. may be combined using exponential forgetting to provide a combined α.

Figure 6:
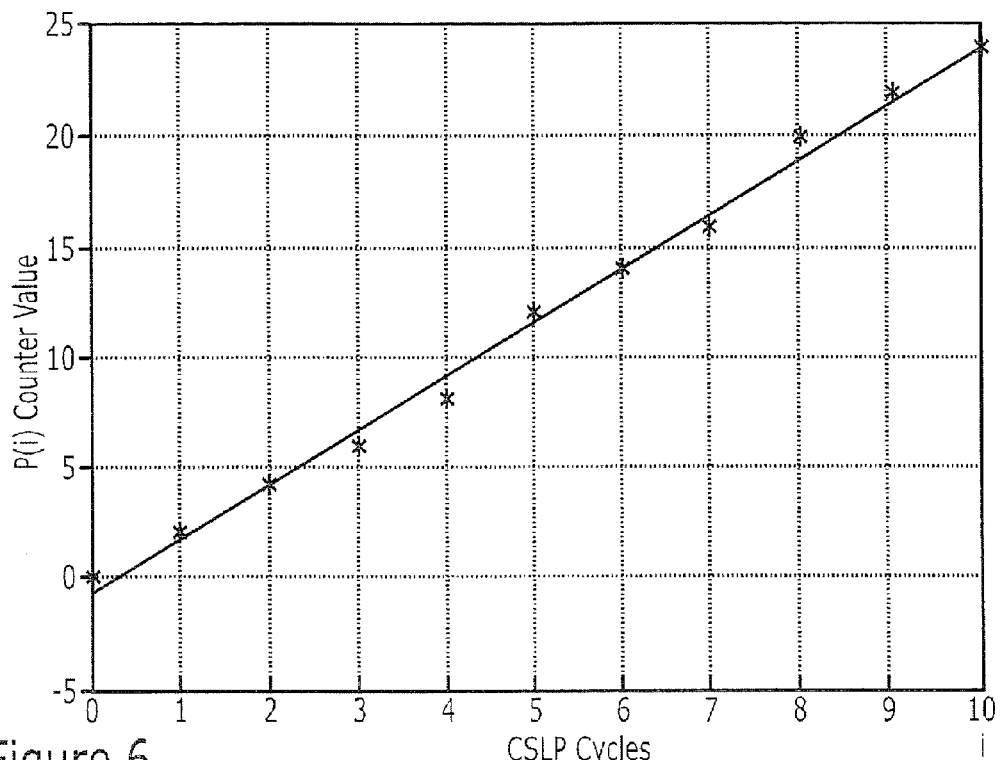
FIG. 6 is a graph illustrating a relationship between incremented counter values and respective cycles of low power clock signal according to some embodiments of the present invention.
Figure 7:
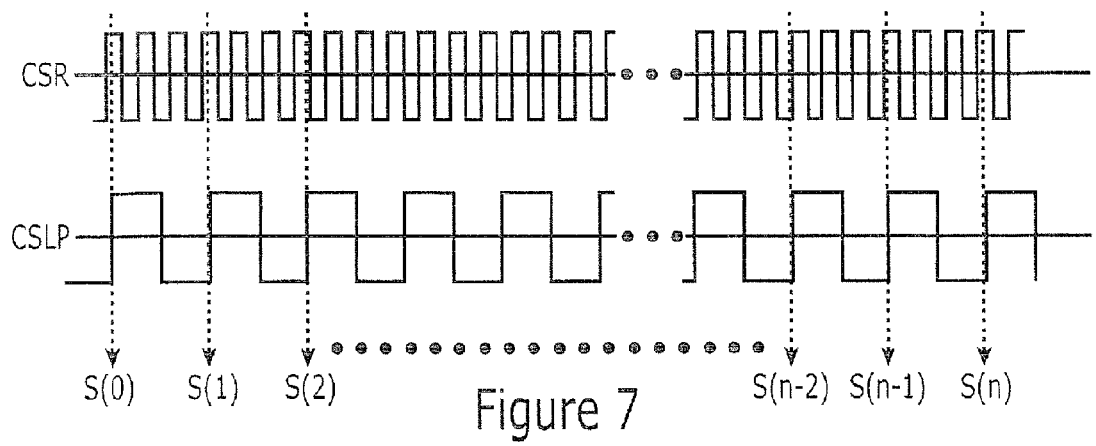
FIG. 7 is a timing diagram illustrating a reference clock signal and a low power clock signal as used to calibrate the low power clock signal using linear regression according to some embodiments of the present invention.

According to additional embodiments of the present invention, the relationship α between reference clock signal CSR and low power clock signal CSLP may be determined using linear regression. FIG. 6 is a graph illustrating an example of incremented counter values generated by counter 201 (shown on the vertical y-axis) plotted against respective cycles of low power clock signal CSLP (shown on the horizontal x-axis). More particularly, plots of the outputs P(1) to P(n) of counter 201 (i.e., a number of edges of reference clock signal CSR shown as *) taken at a rising edge of each cycle n of low power clock signal CSLP with counter 201 being reset to zero at a rising edge of low power clock signal CSLP cycle zero (n=0) as shown in FIG. 7. The dashed line is an example of a linear regression through the plotted counter value outputs. Accordingly, the slope of the dashed line (i.e., the regression coefficient) can be used to determine the relationship α between a frequency of low power clock signal CSLP and reference clock signal CSR such that:

FCSLP=αFCSR.

More particularly, a straight line for the data of FIG. 6 may be determined using a best fit (least mean square) regression analysis. While data for 10 consecutive cycles of low power clock signal CSLP is shown by way of example in FIG. 6, any number of samples may be taken over a wake period and/or samples corresponding to non-consecutive cycles of low power clock signal CSLP may be used.

Respective calculations of relationship α may thus be provided for a plurality of different waking periods W (shown in FIG. 5) using linear regression as discussed above. According to some embodiments of the present invention, the relationship α calculated during a wake period W may be used together with the low power clock signal CSLP to time the following sleep period without considering calculations of the relationship α from other wake periods.

According to other embodiments of the present invention, calculations of the relationship α from multiple wake periods may be combined, and the result of the combination may be used together with the low power clock signal CSLP to time a sleep period. For example, calculations of the relationship α from a fixed number preceding of wake periods may be averaged so that the combination is a moving average. Moreover, the individual calculations of the relationship α may be weighted evenly when determining the average, or more recent calculations of the relationship α may be weighted more heavily than less recent calculations when determining the average. In addition or in an alternative, individual calculations of the relationship α may be combined using exponential forgetting.

According to still other embodiments of the present invention, data from different wake periods can be combined before performing regression analysis on the combined data. For example, counter values P(x, y) with samples x (corresponding to low power clock signal cycles from 0 to n in a same wake period) taken from different wake periods y (from 0 to m) may be saved, and corresponding counter values from the different wake periods may be combined, for example, using averaging (moving, weighted, and/or non-weighted) and/or exponential forgetting. The results of these combinations may then be used to calculate the relationship α using linear regression. In other words, the following combinations can be made:

Combine initial samples P(0, 0) to P(0, m) to provide combined sample PP(0);
Combine first samples P(1, 0) to P(1, m) to provide combined sample PP(1);
. . .
Combine first samples P(n−1, 1) to P(n−1, m) to provide combined sample PP(1);
Combine first samples P(n, 0) to P(n, m) to provide combined sample PP(n).

The relationship α can then be calculated by applying linear regression to combined samples PP(0) to PP(n).

Operations of applying linear regression to counter values to determine a regression coefficient will now be discussed. As discussed above, the counter 201 may generate incremented counter values P(i) responsive to edges (of a same transition type such as a rising edge) of reference clock signal CSR which may have a frequency of about 26 MHz. The counter 201 may be reset to an initial counter value P(0)=0 at a rising edge of an initial cycle of the low power clock signal CSLP, and the counter 201 may count to a final value P(N) on a rising edge of an $N^{th}$ cycle of low power clock signal CSLP. An estimate of the frequency of the low power clock signal CSLP may be calculated as:

$$f_{CSLP(estimate)} = \frac{N}{p(N)} \cdot f_{CSR}.$$

Because P(N) is an integer value, an error can be determined as:

$$E = \frac{f_{CSR}}{N \cdot f_{CSLP}}.$$

By using linear regression to estimate the relationship α between frequencies of low power clock signal CSLP and reference clock signal CSR as discussed above, intermediate values P(i) may be used to increase an accuracy of calibration of low power clock signal CSLP.

When a straight line is fit to P(i) using linear regression as shown in FIG. 6, the relationship α may be determined as an inverse of a regression coefficient R of the line where:

$$R = \frac{(N+1) \cdot \sum_{i=0}^{N} x \cdot y - \sum_{i=0}^{N} x \cdot \sum_{i=0}^{N} y}{(N+1) \cdot \sum_{i=0}^{N} x^2 - \sum_{i=0}^{N} x \cdot \sum_{i=0}^{N} x}$$

$$R = \frac{(N+1) \cdot \sum_{i=0}^{N} i \cdot P(i) - \sum_{i=0}^{N} i \cdot \sum_{i=0}^{N} P(i)}{(N+1) \cdot \sum_{i=0}^{N} i^2 - \sum_{i=0}^{N} i \cdot \sum_{i=0}^{N} i}$$

$$\sum_{i=0}^{N} i = \frac{N+1}{2} \cdot N$$

$$\sum_{i=0}^{N} i^2 = \frac{2 \cdot N + 1}{3} \cdot \frac{N+1}{2} \cdot N$$

An estimation of the frequency of the low power clock signal CSLP can be calculated as $f_{CSLP} = \alpha f_{CSR}$, or using the formula illustrated in FIG. 16. Using the formulation of the regression coefficient R discussed above and shown in FIG. 16, the summations may be implemented using adding circuits as discussed below with respect to FIG. 8.

Figure 8:
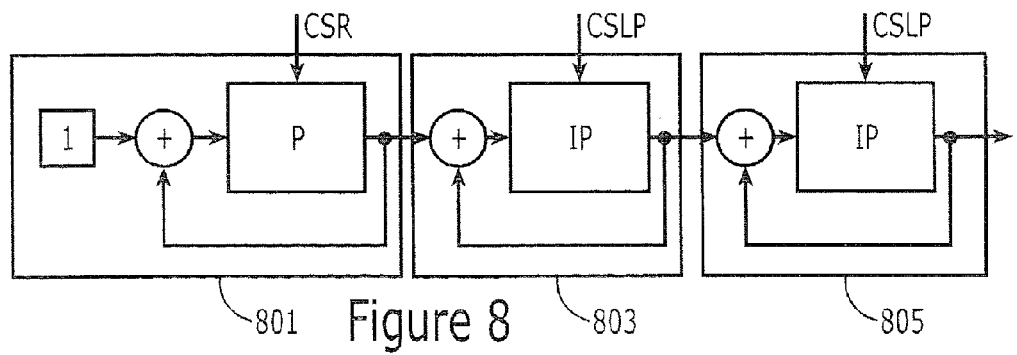
FIG. 8 is a block diagram illustrating adding circuits that used to provide summations for linear regression according to embodiments of the present invention.

FIG. 8 is a block diagram illustrating adding circuits 801, 803, and 805 that may be used in the calibration circuit of FIG. 1 to provide summations for a linear regression according to embodiments of the present invention. At an initial rising edge of low power clock signal CSLP beginning a calibration window, the registers P, IP, and IIP of the respective adding circuits 801, 803, and 805 may be reset to zero, and the current value register P of adding circuit 801 may be incremented by 1 at each successive rising edge of the reference clock signal CSR. At each successive rising edge of the low power clock signal CSLP (identifying successive cycles of CSLP), the current value of the register IP is added to the current value of the register P and the result is saved in the register IP. At each successive rising edge of the low power clock signal CSLP (identifying successive cycles of CSLP), the current value of the register IIP is added to the current value of the register IP and the result is saved in the register IIP.

While block 801 has been referred to as an adding circuit, block 801 may also be referred to as a counter. Moreover, the adding circuits 803 and 805 may be referred to as integrators. In other words, the adding circuit 803 integrates values generated by counter 801 at rising edges of low power clock signal CSLP, and the adding circuit 805 integrates values generated by adding circuit 803 at rising edges of low power clock signal CSLP.

After N cycles of the low power clock signal, the values of the registers IP and IIP may be read by processor 103. The processor 103 may then calculate an estimate of the frequency of low power clock signal CSLP using the equations provided in FIG. 9. FIG. 13 is a table illustrating examples of values of registers P(i), IP(i), and IIP(i) over a 1.0 ms calibration window with a reference clock signal CSLP frequency of 26 MHz, with low power clock signal frequency of 32 kHz, with a phase increment Δϕ of 0.5, and with i indicating an elapsed number of low power clock signals.

A calibration error may be a function of a phase offset ϕ0 and a phase increment Δϕ. A phase offset ϕ0 is a difference in start phases of reference clock signal CSR and low power clock signal CSLP. A phase increment Δϕ is a non-integer part of a ratio between frequencies of reference clock signal CSR and low power clock signal CSLP (a number between −0.5 and 0.5).

If a period of low power clock signal CSLP is not an integer multiple of a period of reference clock signal CSR, an estimation of a frequency of low power clock signal CSLP may be better than if a period of low power CSLP is an integer multiple of a period of reference clock signal CSR. Results of the linear regression may actually be improved, for example, if there is some non-linearity of the data points provided in FIG. 6. This effect may be demonstrated by calculating a calibration error as a function of a phase offset ϕ0 (of reference clock signal CSR) and a phase increment Δϕ (of reference clock signal CSR) per cycle of low power system clock CSLP (where $\Delta\phi/T_{CSLP}$ represents a frequency offset of reference clock CSR compared with its nominal value when it is an integer multiple of the frequency of low power clock signal CSLP).

Figures 9, 10:
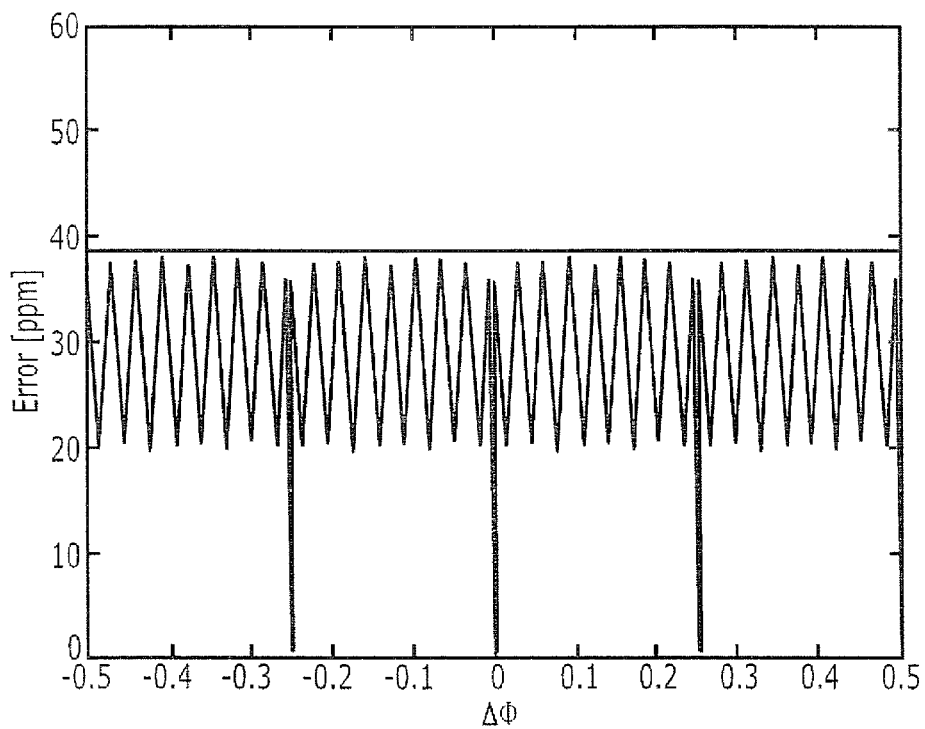
FIG. 9 illustrates equations used to estimate frequencies according to some embodiments of the present invention.
FIGS. 10-12 are graphs illustrating examples calibration errors as a function of $\Delta\phi$ when calculating estimates of a frequency of low power clock signal CSLP according to different embodiments of the present invention.
Figure 11:
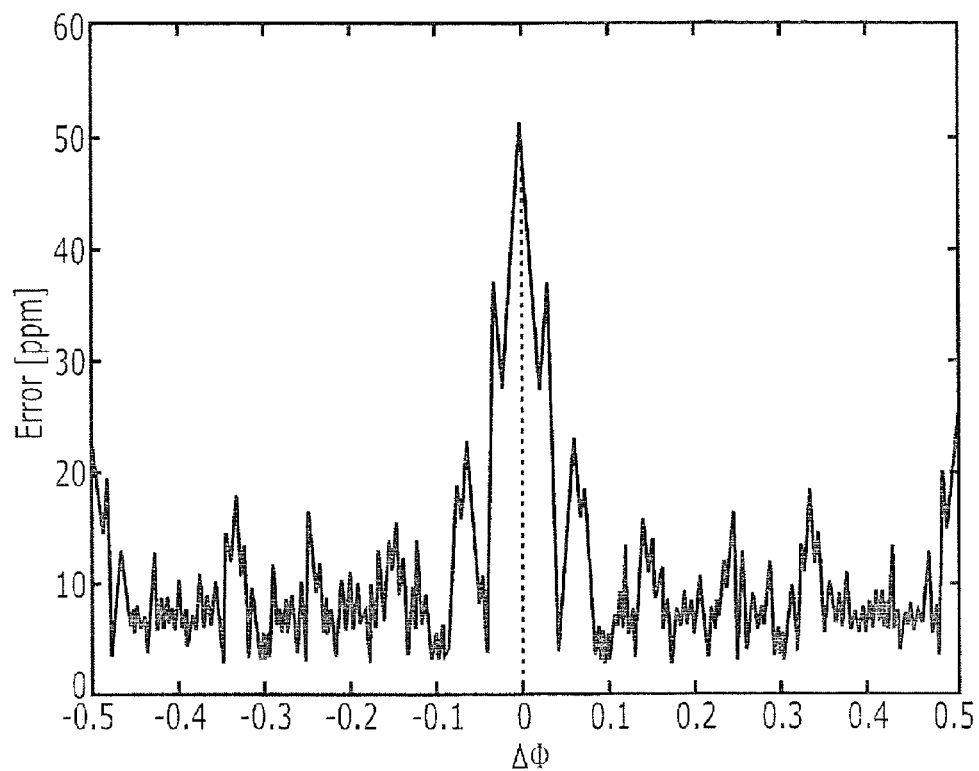
Figure 12:
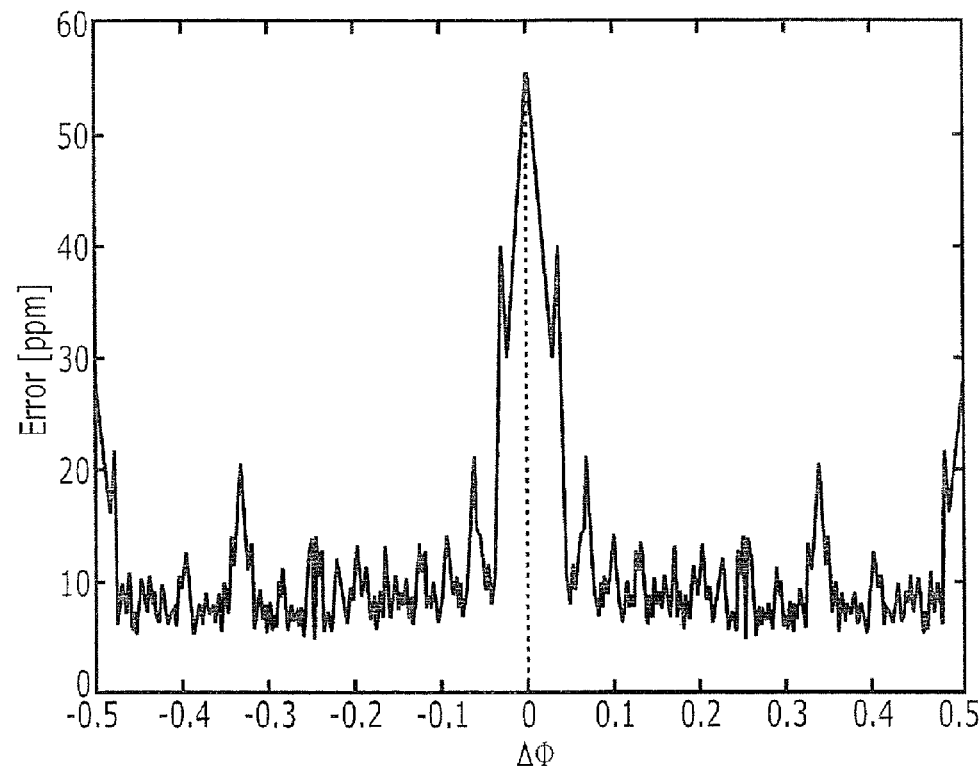

FIGS. 10-12 are graphs illustrating examples calibration errors (measured in parts per million or ppm) as a function of Δϕ when calculating estimates of a frequency of low power clock signal CSLP according to different embodiments of the present invention. In each of FIGS. 10-12, a frequency of reference clock signal CSR is 26 MHz, a frequency of low power clock signal CSLP is 32 kHz, and a calibration window (over which the calibrations are performed) is 1 ms. In FIG. 10, the graph illustrates errors that may occur when a single final counter value is used to calculate an estimate of a frequency of low power clock signal CSLP as discussed, for example, in U.S. Pat. No. 7,272,078. In FIG. 11, the graph illustrates errors that may occur when 10 overlapping calibration periods are averaged to calculate an estimate of a frequency of low power clock signal CSLP as discussed above with respect to FIGS. 2 and 3. In FIG. 12, the graph illustrates errors that may occur when a regression coefficient (calculated using linear regression) is used to calculate a frequency of low power clock signal CSLP as discussed above with respect to FIGS. 6, 7, 8, and 9. If the ratio between the nominal frequencies of CSR and CSLP is an integer (so that Δϕ=0), the resulting error may be relatively large. Accordingly, an error may be reduced by choosing frequencies that do not have such an integer relationship. Moreover, nominal frequencies of CSR and CSLP may be selected to provide a relatively low error (e.g., by selecting nominal frequencies of CSR and CSLP so that Δϕ=0.1 as shown in FIG. 11). If the CSR frequency is 26 MHZ, if the CSLP frequency should be about 32 kHz, and if the CSLP frequency is selected to be 32.015762 kHz, the nominal ratio may be 812.1. For a CSLP frequency of 32.768 kHz, the nominal ratio may be 793.46. Moreover, a Δϕ of about 0.46 may provide relatively low error values.

FIG. 14 is a block diagram illustrating operations of calibrating low power clock signal CSLP using reference clock signal CSR and linear regression as discussed above with respect to FIGS. 7-9. At block 1401, incremented counter values P(i) may be generated at counter 801 responsive to edges of reference clock signal CSR. For each cycle of low power clock CSLP over a calibration window, calculations may be performed based on respective incremented counter values at block 1403. At block 1405, a relationship between the reference and low power clock signals CSLP may be determined using linear regression and the calculations based on the respective incremented counter values for the different cycles of the low power clock signal CSLP.

At block 1403, performing calculations based on the respective incremented counter values may include performing the calculations based on the respective incremented counter values taken at edges of the same transition type of the respective cycles of the low power clock signal CSLP. At block 1405, determining the relationship between the reference and low power clock signals CSR and CSLP using linear regression may include calculating a regression coefficient using the incremented counter values from the at least three different cycles of the low power clock signal CSLP.

FIG. 15 is a flow diagram illustrating operations of calibrating low power clock CSLP using reference clock CSR with data from different waking periods W as discussed above with respect to FIG. 5. During a first waking period W, a receiver (of transceiver 115) may be operated using reference clock signal CSR at block 1501. For a first calibration period during the first waking period W, a number of edges of reference clock signal CSR occurring during the first calibration period may be determined at block 1503. During a sleep period after the first waking period W, a duration of the sleep period may be timed using low power clock signal CSLP with reference clock signal CSR turned off at block 1505. During a second waking period after the sleep period, the receiver may be operated using the reference clock signal CSR at block 1507. For a second calibration period during the second waking period, a number of edges of the reference clock signal CSR occurring during the second calibration period may be determined at block 1508. At block 1509, a relationship between reference and low power clock signals CSR and CSLP may be determined using the number of edges of the reference clock signal CSR occurring during each of the first and second intervals of the first and second wake periods.

Determining the relationship between reference and low power clock signals CSR and CSLP at block 1509 may include calculating an average based on the number of edges of reference clock signal CSR occurring during the first and second calibration periods. Such an average may be calculated as a moving average so that information from a predetermine number of most recent wake periods is considered, for example, using:

$$A(k) = \frac{1}{N}\sum_{i=1}^{N} X(k-i).$$

In addition, or in an alternative, an average may be calculated as a weighted average so that information from more recent wake periods is weighted more heavily than information from less recent wake periods. Moreover, information from different wake periods may be combined using exponential forgetting so that information from less recent wake periods is weighted exponentially less than information from more recent wake periods, for example, using:

$A(k) = \alpha X(k) + (1-\alpha)A(k-1)$, with $\alpha < 1$.

Moreover, multiple calibration periods may be provided during a same wake period. At block 1503, for example, a number of edges of the reference clock signal CSR occurring during a third calibration period during the first wake period may be determined, and at block 1508, a number of edges of the reference clock signal CSR occurring during a fourth calibration period during the second wake period may be determined. At block 1509, determining the relationship between reference and low power clock signals CSLP may include determining a first representation of the relationship between the reference and low power clock signals CSR and CSLP for the first waking period using the number of edges of the reference clock signal CSR occurring during the first calibration period and the number of edges of the reference clock signal CSR occurring during the third calibration period. A second representation of the relationship between the reference and low power clock signals for the second waking period may be determined using the number of edges of the reference clock signal CSR occurring during the second calibration period and the number of edges of the reference clock signal CSR occurring during the fourth calibration period. After determining the first and second representations of the relationship between the reference and low power clock signals CSR and CSLP, an aggregate representation of the relationship between the reference and low power clock signals CSR and CSLP may be determined using the first and second representations.

Determining the relationship between the reference and low power clock signals at block 1509 may include determining a first representation of the relationship between the reference and low power clock signals CSR and CSLP using the number of edges of the reference clock signal occurring during the first calibration period and the number of edges of the reference clock signal occurring during the second calibration period. A second representation of the relationship between the reference and low power clock signals CSR and CSLP may be determined using the number of edges of the reference clock signal CSR occurring during the third calibration period and the number of edges of the reference clock signal CSR occurring during the fourth calibration period. After determining the first and second representations of the relationship between the reference and low power clock signals CSR and CSLP, an aggregate representation of the relationship between the reference and low power clock signals CSR and CSLP may be determined using the first and second representations. According to other embodiments of the present invention, determining the relationship between the reference and low power clock signals at block 1509 may include performing linear regression using the number of edges of the reference clock signal CSR occurring during the first calibration period, during the second calibration period, during the third calibration period, and during the fourth calibration period.

In the drawings and specification, there have been disclosed embodiments of the invention and, although specific terms are employed, they are used in a generic and descriptive sense only and not for purposes of limitation, the scope of the invention being set forth in the following claims.

That which is claimed is:

1. A method of calibrating a first clock signal using a second clock signal and a plurality of calibration periods, the method comprising:

generating incremented counter values at a counter responsive to edges of the second clock signal;

for each of the plurality of calibration periods, storing in memory an initial incremented counter value from the counter at an initial edge of the first clock signal for the respective calibration period and storing in the memory a final incremented counter value from the counter at a final edge of the first clock signal for the respective calibration period wherein at least two of the plurality of calibration periods are overlapping with different initial and final edges of the first clock signal;

for each of the plurality of calibration periods, determining a number of edges of the second clock signal occurring during the respective calibration period using the initial and final incremented counter values stored in the memory; and determining a relationship between the first and second clock signals using a sum of a number of edges of the second clock signal occurring during each of the plurality of calibration periods and using a sum of a number of first clock signal cycles occurring during each of the plurality of calibration periods.

2. A method according to claim 1 wherein determining the relationship comprises determining a ratio using the sum of the number of edges of the second clock signal occurring during each of the plurality of calibration periods and using the sum of the number of first clock signal cycles occurring during each of the plurality of calibration periods.

3. A method according to claim 1 wherein an initial edge of the first clock signal for a first of the plurality of the calibration periods precedes an initial edge of the first clock signal for a second of the plurality of the calibration periods, wherein the initial edge of the first clock signal for the second of the plurality of the calibration periods precedes a final edge of the first clock signal for the first of the plurality of the calibration periods, and wherein the final edge of the first clock signal for the first of the plurality of the calibration periods precedes a final edge of the first clock signal for the second of the plurality of the calibration periods.

4. A method according to claim 1 wherein a same number of first clock cycles occur during each of the plurality of calibration periods.

5. A method according to claim 1 wherein the plurality of calibration periods includes k calibration periods beginning at k consecutive edges of the same transition type of the clock.

6. A method according to claim 1 wherein generating incremented counter values comprises generating incremented counter values at the counter responsive to edges of a same transition type of the second clock signal.

7. A method according to claim 1 wherein a frequency of the first clock signal is not an integer multiple of a frequency of the second clock signal and wherein the frequency of the second clock signal is not an integer multiple of the frequency of the first clock signal.

8. A method according to claim 1 wherein the second clock is coupled to a receiver, the method further comprising:

during a first waking period, operating the receiver using the second clock;

during a sleep period after the first waking period, timing a duration of the sleep period using the first clock with the second clock turned off; and during a second waking period after the sleep period, operating the receiver using the second clock.

9. A method according to claim 1 wherein at least one of said determining a number of edges and/or determining a relationship comprise operations performed on a processor.

10. A mobile device comprising:

a first clock signal generator configured to generate a first clock signal;

a second clock signal generator configured to generate a second clock signal;

a counter coupled to the second clock signal generator wherein the counter is configured to generate incremented counter values at a counter responsive to edges of the second clock signal;

memory coupled to the counter wherein the memory is configured for each of a plurality of calibration periods to store an initial incremented counter value from the counter at an initial edge of the first clock signal for the respective calibration period and to store a final incremented counter value from the counter at a final edge of the first clock signal for the respective calibration period wherein at least two of the plurality of calibration periods are overlapping with different initial and final edges of the first clock signal; and a processor coupled to the memory wherein for each of the plurality of calibration periods the processor is configured to determine a number of edges of the second clock signal occurring during the respective calibration period using the initial and final incremented counter values, and wherein the processor is configured to determine a relationship between the first and second clock signals using a sum of a number of edges of the second clock signal occurring during each of the plurality of calibration periods and using a sum of a number of first clock signal cycles occurring during each of the plurality of calibration periods.

11. A mobile device according to claim 10 wherein the processor is configured to determine the relationship by determining a ratio using the sum of the number of edges of the second clock signal occurring during each of the plurality of calibration periods and using the sum of the number of first clock signal cycles occurring during each of the plurality of calibration periods.

12. A mobile device according to claim 10 wherein an initial edge of the first clock signal for a first of the plurality of the calibration periods precedes an initial edge of the first clock signal for a second of the plurality of the calibration periods, wherein the initial edge of the first clock signal for the second of the plurality of the calibration periods precedes a final edge of the first clock signal for the first of the plurality of the calibration periods, and wherein the final edge of the first clock signal for the first of the plurality of the calibration periods precedes a final edge of the first clock signal for the second of the plurality of the calibration periods.

13. A mobile device according to claim 10 wherein a same number of first clock cycles occur during each of the plurality of calibration periods.

14. A mobile device according to claim 10 wherein the plurality of calibration periods includes k calibration periods beginning at k consecutive edges of the same transition type of the clock.

15. A mobile device according to claim 10 wherein the counter is configured to generate the incremented counter values by generating the incremented counter values responsive to edges of a same transition type of the second clock signal.

16. A mobile device according to claim 10 wherein a frequency of the first clock signal is not an integer multiple of a frequency of the second clock signal and wherein the frequency of the second clock signal is not an integer multiple of the frequency of the first clock signal.

17. A mobile device according to claim 10 further comprising:

a radio receiver coupled to the second clock signal generator, wherein the radio receiver is configured to operate using the second clock during a first waking period, wherein the processor and/or the radio receiver is/are configured to time a duration of the sleep period using the first clock with the second clock turned off during a sleep period for the radio receiver after the first waking period, and wherein the radio receiver is configured to operate using the second clock during a second waking period after the sleep period.

* * * * *